United States Patent
Patil et al.

(10) Patent No.: US 11,614,489 B2
(45) Date of Patent: Mar. 28, 2023

(54) BATTERY MANAGEMENT SYSTEM AND METHOD FOR DETERMINING ACTIVE MATERIAL CONTENT IN ELECTRODE OF BATTERY

(71) Applicant: Samsung Electronics Co., Ltd., Suwon-si (KR)

(72) Inventors: Rajkumar Subhash Patil, Bangalore (IN); Shashishekara Parampalli Adiga, Bangalore (IN); Anshul Kaushik, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 126 days.

(21) Appl. No.: 17/217,364

(22) Filed: Mar. 30, 2021

(65) Prior Publication Data

US 2021/0325470 A1 Oct. 21, 2021

(30) Foreign Application Priority Data

Apr. 13, 2020 (IN) .............................. 202041016004
Jan. 25, 2021 (KR) ........................ 10-2021-0010252

(51) Int. Cl.
| | |
|---|---|
| *G01R 31/36* | (2020.01) |
| *H01M 10/44* | (2006.01) |
| *G01R 31/392* | (2019.01) |
| *G01N 27/22* | (2006.01) |
| *G01R 31/387* | (2019.01) |
| *H01M 10/48* | (2006.01) |

(52) U.S. Cl.
CPC ....... *G01R 31/3648* (2013.01); *G01N 27/228* (2013.01); *G01R 31/387* (2019.01); *G01R 31/392* (2019.01); *H01M 10/44* (2013.01); *H01M 10/48* (2013.01)

(58) Field of Classification Search
None
See application file for complete search history.

(56) References Cited

U.S. PATENT DOCUMENTS

| | | | |
|---|---|---|---|
| 4,295,097 A | * | 10/1981 | Thompson ......... G01R 31/3828 324/426 |
| 6,362,598 B2 | | 3/2002 | Laig-Hörstebrock et al. |

(Continued)

OTHER PUBLICATIONS

Zheng et al., "Incremental capacity analysis and differential voltage analysis based state of charge and capacity estimation for lithium-ion batteries", Mar. 5, 2018, Energy, pp. 759-769 (Year: 2018).*

(Continued)

*Primary Examiner* — Brent A. Fairbanks
(74) *Attorney, Agent, or Firm* — NSIP Law

(57) ABSTRACT

A battery management system (BMS) and method for determining an active material content in an electrode includes determining a first peak in an inverse-differential capacity analysis curve of a the battery, determining a second peak in an incremental capacity analysis (ICA) curve associated with the at least one electrode, mapping the first peak of the inverse-differential capacity analysis curve to the second peak of the ICA curve, determining an active material content in the at least one electrode of the battery based on the mapping, and optimizing a performance of the battery based on the active material content in the at least one electrode.

20 Claims, 12 Drawing Sheets

(56) References Cited

U.S. PATENT DOCUMENTS

| | | | |
|---|---|---|---|
| 6,515,454 B2 | 2/2003 | Schoch | |
| 8,653,793 B2 | 2/2014 | Ueki et al. | |
| 8,680,815 B2* | 3/2014 | Wang | G01R 31/392 |
| | | | 320/132 |
| 8,742,725 B2 | 6/2014 | Tsujiko et al. | |
| 9,097,773 B2 | 8/2015 | Joe et al. | |
| 10,126,369 B2 | 11/2018 | Torai et al. | |
| 10,408,886 B2 | 9/2019 | Joe et al. | |
| 2011/0012604 A1 | 1/2011 | Tsujiko et al. | |
| 2015/0100260 A1 | 4/2015 | Joe et al. | |
| 2016/0061908 A1* | 3/2016 | Torai | G01R 31/389 |
| | | | 702/63 |
| 2017/0018797 A1 | 1/2017 | Murashi et al. | |
| 2017/0033572 A1 | 2/2017 | Becker et al. | |
| 2021/0359347 A1* | 11/2021 | Stefanopoulou | H01M 10/0525 |

OTHER PUBLICATIONS

Energsoft, "Differential capacity analysis", Apr. 27, 2018, blog post (Year: 2018).*

* cited by examiner

BATTERY MANAGEMENT SYSTEM AND METHOD FOR DETERMINING ACTIVE MATERIAL CONTENT IN ELECTRODE OF BATTERY

CROSS-REFERENCE TO RELATED APPLICATIONS

This application claims the benefit under 35 USC § 119(a) of Indian Patent Application No. 202041016004 filed on Apr. 13, 2020, in the Indian Intellectual Property Office and Korean Patent Application No. 10-2021-0010252 filed on Jan. 25, 2021, in the Korean Intellectual Property Office, the entire disclosures of which are incorporated herein by reference for all purposes.

BACKGROUND

Field

The following description relates to a battery management system (BMS) and determining an active material content in an electrode of a battery.

Description of Related Art

A battery may be sourced from a vendor or a service provider, and the vendor or the service provider may provide a total capacity, a rated voltage, and an operational condition (e.g., power, temperature, etc.) of a cell. To develop a robust state estimation model to be used in a battery management system (BMS), an amount of lithium that is to be hosted in an anode and a cathode (or active material loading) may need to be determined. The performance degradation related to the capacity fade of the anode and the cathode that occurs as the battery ages may also need to be tracked.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a processor-implemented method of monitoring at least one electrode of a battery, the method including determining a first peak in an inverse-differential capacity analysis curve of the battery, determining a second peak in an incremental capacity analysis (ICA) curve associated with the at least one electrode, mapping the first peak of the inverse-differential capacity analysis curve to the second peak of the ICA curve, and determining an active material content in the at least one electrode of the battery based on the mapping.

The method may include determining an available capacity corresponding to the at least one electrode, in response to a decrease in a state of health (SOH) of the battery. The determining of the first peak in the inverse-differential capacity analysis curve of the cell may include determining the first peak in the inverse-differential capacity analysis curve of the cell based on a state of charge (SOC) associated with the at least one electrode when the cell is fully discharged, an SOC associated with the at least one electrode when the cell is fully charged, an inverse-differential capacity analysis curve value associated with a commercial cell, and an ICA curve value obtained from a difference between a potential of a positive electrode and a potential of a negative electrode.

The determining of the second peak in the ICA curve associated with the electrode may include determining the second peak in the ICA curve associated with the electrode based on a state of charge (SOC) associated with the at least one electrode when the cell is fully discharged, an SOC associated with the at least one electrode when the cell is fully charged, an ICA curve value associated with a commercial cell, and an ICA curve value obtained from a difference between a potential of a positive electrode and a potential of a negative electrode.

The determining of the active material content in the at least one electrode of the battery may include obtaining first state of charge (SOC) values, $SOC_{a1}$ and $SOC_{a2}$, from potential values $V_{a1}$ and $V_{a2}$ comprising two peaks of the positive electrode of the at least one electrode, respectively, obtaining second SOC values, $SOC_{c1}$ and $SOC_{c2}$, from potential values at $V_{c1}$ and $V_{c2}$, respectively comprising two peaks of the negative electrode of the at least one electrode, and determining the active material content in the at least one electrode of the battery based on any one of the first SOC values, $SOC_{a1}$ and $SOC_{a2}$, and the second SOC values, $SOC_{c1}$ and $SOC_{c2}$.

The determining of the active material content in the at least one electrode of the battery may include determining the active material content in the at least one electrode of the battery based on any one of an absolute value of a difference between the $SOC_{a1}$ and the $SOC_{a2}$, and an absolute value of a difference between the $SOC_{c1}$ and the $SOC_{c2}$.

The at least one electrode may include a positive electrode and a negative electrode.

The mapping of the first peak determined in the inverse-differential capacity analysis curve to the second peak determined in the ICA curve associated with the electrode may include obtaining an open circuit potential (OCP) curve of the positive electrode, an OCP curve of the negative electrode, an open circuit voltage (OCV) curve of another cell, and an ICA curve of the battery, normalizing a state of charge (SOC) range of each of the positive electrode and the negative electrode to be between 0 and 1 based on the OCP curve of the positive electrode and the OCP curve of the negative electrode, minimizing a peak difference between respective normalized SOC ranges of the positive electrode and the negative electrode based on the OCV curve and the ICA curve, and mapping a peak value associated with the positive electrode and a peak value associated with the negative electrode based on the minimized peak difference.

An inverse-differential capacity analysis may include dividing a rate of change in capacity by a rate of change in voltage versus capacity.

An ICA may include dividing a rate of change in capacity by a rate of change in voltage versus voltage.

In another general aspect, there is provided a battery management system (BMS), including a processor configured to determine a first peak in an inverse-differential capacity analysis curve of a battery, determine a second peak in an incremental capacity analysis (ICA) curve associated with at least one electrode, map the first peak of the inverse-differential capacity analysis curve to the second peak of the ICA curve, and determine an active material content in the at least one electrode of a battery based on the mapping.

The processor may be configured to determine an available capacity corresponding to the at least one electrode as a state of health (SOH) of the battery decreases.

The processor may be configured to determine the inverse-differential capacity analysis curve of the cell based on a state of charge (SOC) associated with the at least one electrode when the cell is fully discharged, an SOC associated with the at least one electrode when the cell is fully charged, an inverse-differential capacity analysis curve value associated with a commercial cell, and an ICA curve value obtained from a difference in potential between a positive electrode and a negative electrode.

The processor may be configured to determine the second peak in the ICA curve associated with the at least one electrode based on an SOC associated with the at least one electrode when the cell is fully discharged, an SOC associated with the at least one electrode when the cell is fully charged, an ICA curve value associated with a commercial cell, and an ICA curve value obtained from a difference in potential between a positive electrode and a negative electrode.

The processor may be configured to obtain first state of charge (SOC) SOC values as $SOC_{a1}$ and $SOC_{a2}$ from potential values at $V_{a1}$ and $V_{a2}$ comprising two peaks of the positive electrode of the at least one electrode, respectively, obtain second SOC values as $SOC_{c1}$ and $SOC_{c2}$ from potential values at $V_{c1}$ and $V_{c2}$ comprising two peaks of the negative electrode of the at least one electrode, respectively, and determine the active material content in the at least one electrode of the battery based on any one of the first SOC values, $SOC_{a1}$ and $SOC_{a2}$, and the second SOC values, $SOC_{c1}$ $SOC_{c2}$.

The at least one electrode may include a positive electrode and a negative electrode.

The processor may be configured to obtain an open circuit potential (OCP) curve of a positive electrode, an OCP curve of a negative electrode, an open circuit voltage (OCV) curve of an another cell, and an ICA curve of the battery, normalize a state of charge (SOC) range of each of the positive electrode and the negative electrode to be between 0 and 1 based on the OCP curve of the positive electrode and the OCP curve of the negative electrode, minimize a peak difference between respective normalized SOC ranges of the positive electrode and the negative electrode based on the OCV curve and the ICA curve, and map a peak value associated with the positive electrode and a peak value associated with the negative electrode based on the minimized peak difference.

An inverse-differential capacity analysis may include dividing a rate of change in capacity by a rate of change in voltage versus capacity.

An ICA may include dividing a rate of change in capacity by a rate of change in voltage versus voltage.

Other features and aspects will be apparent from the following detailed description, the drawings, and the claims.

Figure 1:
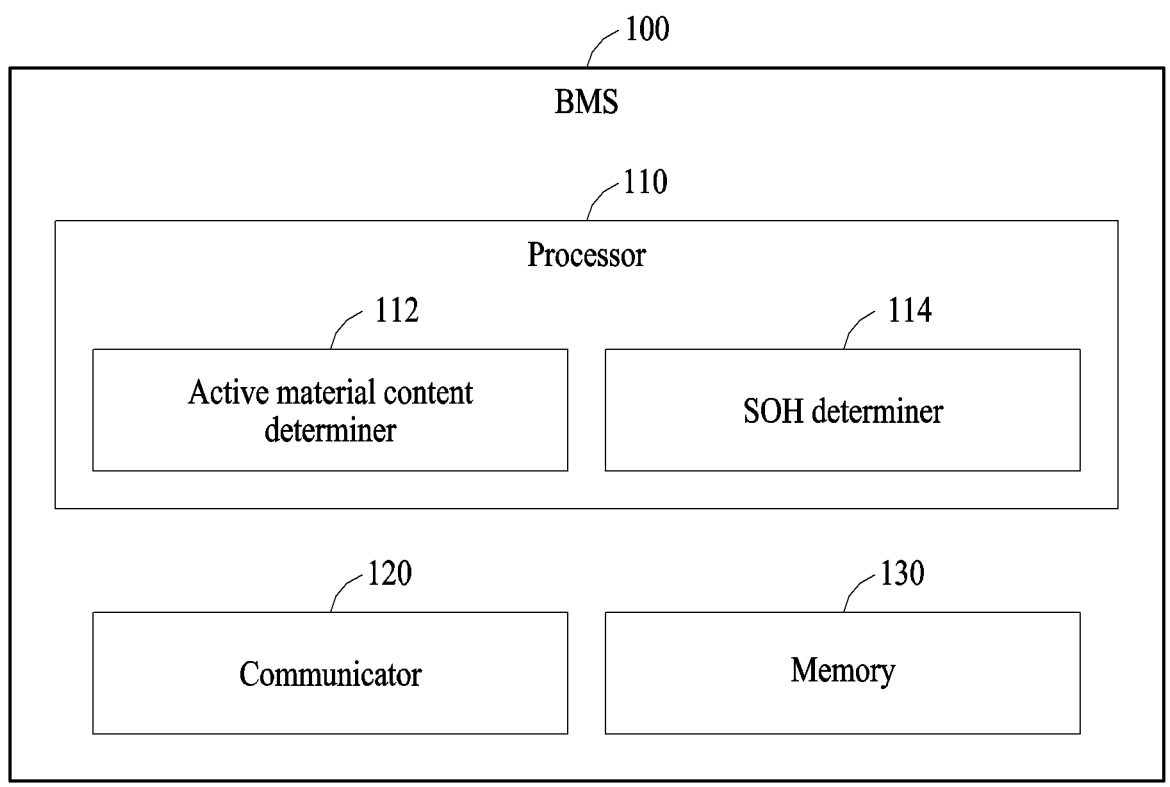
FIG. 1 is a diagram illustrating an example of a battery management system (BMS) for determining an active material content in a positive electrode and a negative electrode of a battery.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only and is not to be limiting of the examples. As used herein, the singular forms (for example, "a", "an", and "the") are intended to include the plural forms as well, unless the context clearly indicates otherwise. As used herein, the term "and/or" includes any one and any combination of any two or more of the associated listed items. As used herein, the terms "include," "comprise," "has," and "have" specify the presence of stated features, integers, steps, operations, elements, components, numbers, and/or a combination thereof, but do not preclude the presence or addition of one or more other features, integers, steps, operations, elements, components, numbers, and/or combinations thereof.

If the specification states that one component is "connected," "coupled," or "joined" to a second component, the first component may be directly "connected," "coupled," or "joined" to the second component, or a third component may be "connected," "coupled," or "joined" between the first component and the second component. However, if the specification states that a first component is "directly connected" or "directly joined" to a second component, a third component may not be "connected" or "joined" between the first component and the second component. Similar expressions, for example, "between" and "immediately between" and "adjacent to" and "immediately adjacent to," are also to be construed in this manner.

Although terms such as A, B, C, (a), (b), (c), "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

The use of the term "may" herein with respect to an example or embodiment (for example, as to what an example or embodiment may include or implement) means that at least one example or embodiment exists where such a feature is included or implemented, while all examples are not limited thereto.

Also, in the description of example embodiments, detailed description of structures or functions that are thereby known after an understanding of the disclosure of the present application will be omitted when it is deemed that such description will cause ambiguous interpretation of the example embodiments.

A BMS and a method for determining an active material content in a battery electrode will be described in detail with reference to FIGS. 1 through 12.

FIG. 1 is a diagram illustrating an example of a BMS 100 for determining an active material content in a positive electrode and a negative electrode of a battery.

Referring to FIG. 1, the BMS 100 includes a processor 110, a communicator 120, and a memory 130. The processor 110 may be connected to the communicator 120 and the memory 130. The processor 110 includes an active material content determiner 112 and a state of health (SOH) determiner 114.

The BMS 100 may be implemented in an electronic device, an electrical vehicle, an autonomous vehicle, and a smart vehicle as non-limiting examples. The electrode device may be a device such as, for example, a cellular phone, a smartphone, a personal digital assistant (PDA), a wireless modem, a tablet computer, a laptop computer, a digital television (DTV), an artificial intelligence (AI) speaker, a home appliance such as a television, a smart television, a refrigerator, a smart home device, an Internet of Things (IoT) device, a wearable electronic device, such as smart watch or smart glasses, a wireless local loop (WLL) station, a universal serial bus (USB) dongle, and an Internet of things (IoT) device.

In an example, the processor 110 may be a hardware-implemented apparatus having a circuit that is physically structured to execute desired operations. For example, the desired operations may be implemented by execution of code or instructions. The hardware-implemented apparatus may include, for example, a microprocessor, a central processing unit (CPU), single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, a processor core, a multi-core processor, and a multiprocessor, an application-specific integrated circuit (ASIC), a field programmable gate array (FPGA), a programmable logic unit (PLU), a central processing unit (CPU), a graphics processing unit (GPU), a neural processing unit (NPU), or any other device capable of responding to and executing instructions in a defined manner. Further description of the processor 110 is given below.

The processor 110 may estimate or determine a positive electrode and a negative electrode that operate an SOC ranges.

In an example, the active material content determiner 112 may obtain an open circuit potential (OCP) curve (e.g., 220 in FIG. 2) of the positive electrode, an OCP curve (e.g., 230 in FIG. 2) of the negative electrode, and an open circuit voltage (OCV) curve (e.g., 210 in FIG. 2) of an another cell. The active material content determiner 112 may also obtain a cell dQ/dV vs V (e.g., 640 in FIG. 6) using an incremental capacity analysis (ICA).

In an example, the active material content determiner 112 may normalize SOC ranges of both the electrodes to be between 0 and 1. The SOC range of the positive electrode may be normalized from 0.3-0.98 (e.g., 310 in FIG. 3) to 0.0-1.0 (e.g., 410 in FIG. 4). The SOC range of the negative electrode may be normalized to be from 0.0-0.97 (e.g., 320 in FIG. 3) to 0.0-1.0 (e.g., 420 in FIG. 4).

The active material content determiner 112 may initialize $SOC_0$ and $SOC_1$ of both the electrodes for a cell model. Here, $SOC_0$ denotes an OCP value at a point at which an SOC is 0, and $SOC_1$ denotes an OCP value at a point at which an SOC is 1.

The active material content determiner 112 may also obtain a model output, an OCV vs SOC curve (e.g., "estimated" in 630 in FIG. 6), dQ/dV vs V (e.g., "estimated" in 640 in FIG. 6), using the ICA. The active material content determiner 112 may determine a difference in dQ/dV vs V peak positions from data that is collected. The active material content determiner 112 may perform optimization on $SOC_0$ and $SOC_1$ to minimize a peak difference.

In an example, the active material content determiner 112 may verify whether a convergence point is satisfied or not. When the convergence point is satisfied, the active material content determiner 112 may stop a process of determining an active material content. When the convergence point is not satisfied, the active material content determiner 112 may update $SOC_0$ and $SOC_1$ of both the electrodes.

The memory 130 may store instructions (or a program) executable by the processor 150. For example, the instructions may include instructions for executing an operation of the processor 110 and/or an operation of each component of the processor 110. The memory 130 may be embodied as a volatile or nonvolatile memory device.

In an example, the volatile memory device may be, for example, a dynamic random-access memory (DRAM), a static RAM (SRAM), a thyristor RAM (T-RAM), a zero-capacitor RAM (Z-RAM), or a twin-transistor RAM (TTRAM).

In an example, the nonvolatile memory device may be, for example, an electrically erasable programmable read-only memory (EEPROM), a flash memory, a magnetic RAM (MRAM), a spin-transfer torque (STT) MRAM (STT-MRAM), a conductive bridging RAM (CBRAM), a ferroelectric RAM (FeRAM), a phase-change RAM (PRAM), a resistive RAM (RRAM), a nanotube RRAM, a polymer RAM (PoRAM), a nano-floating gate memory (NFGM), a holographic memory, a molecular electronic memory device, or an insulator resistance change memory.

The memory 130 may store a result of the operation that is processed and generated by the processor 110, the active material content determiner 112, and/or the state of health (SOH) determiner 114. The processor 110, the active material content determiner 112, and the state of health (SOH) determiner 114 may process data stored in the memory 130. The processor 110, the active material content determiner 112, and the state of health (SOH) determiner 114 may execute a computer-readable code (e.g., software) stored in the memory 130. Further description of the memory 130 is given below.

The communicator 120 may facilitate internal communication between internal hardware components and external devices through one or more wired or wireless networks.

Although FIG. 1 illustrates various hardware components of the BMS 100, examples are not limited thereto. In another example, the BMS 100 may include a less or greater number of components than illustrated. In addition, labels or names of the components may be used only for illustrative purpose and do not limit the scope of the present disclosure. One or more of the components may be combined to perform the same or substantially similar functions to determine an active material content in positive and negative electrodes of a battery.

Figure 2:
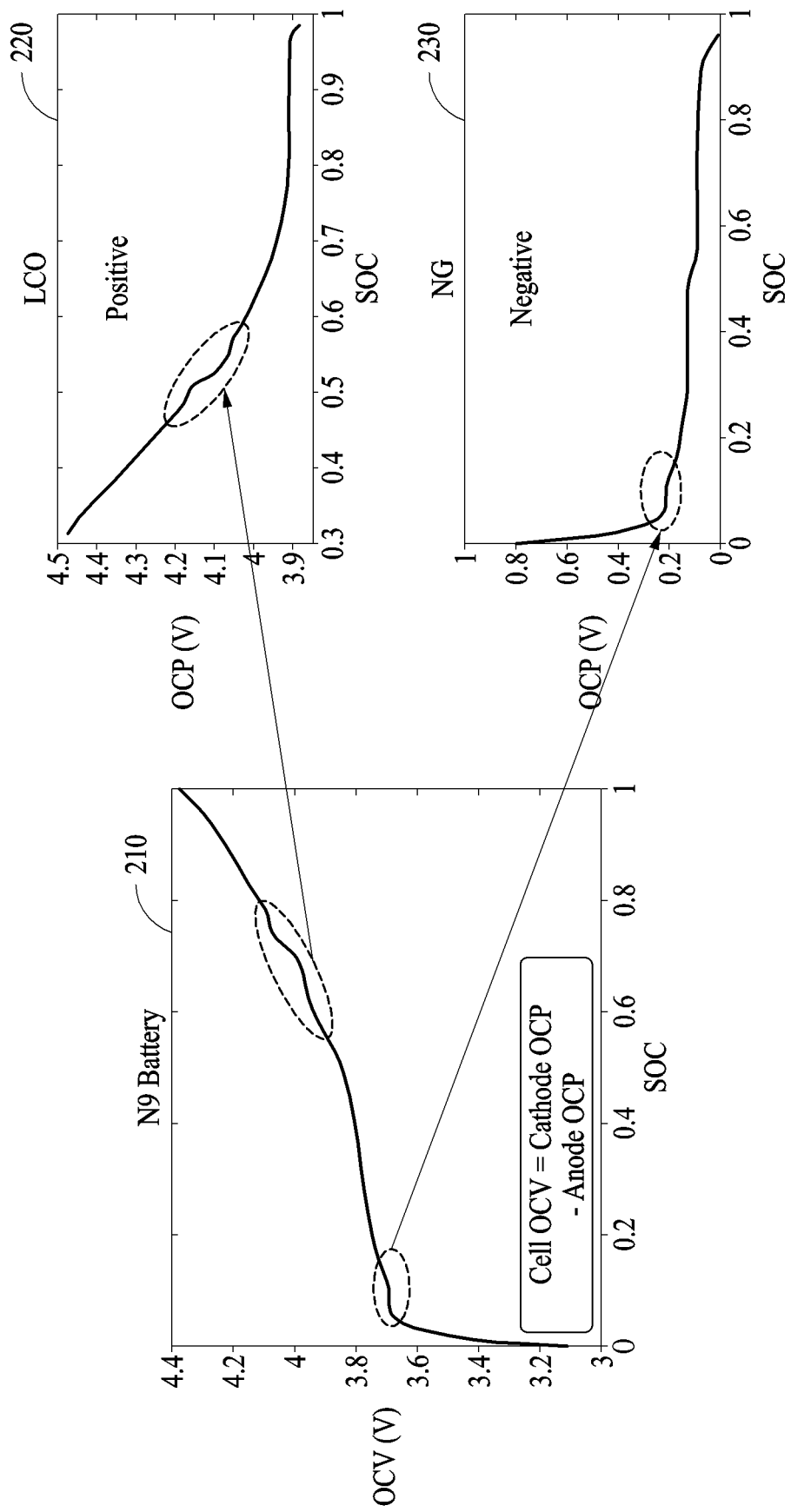
FIG. 2 is an graph illustrating an example of open circuit potentials (OCP) of electrodes and a battery.

FIG. 2 is a graph illustrating an example of OCPs of electrodes and a battery.

Referring to FIG. 2, 210 is a graph indicating an OCV of an another battery, 220 is a graph associated with a lithium cobalt oxide (LCO) electrode, and 230 is a graph associated with a graphite electrode.

Figure 3:
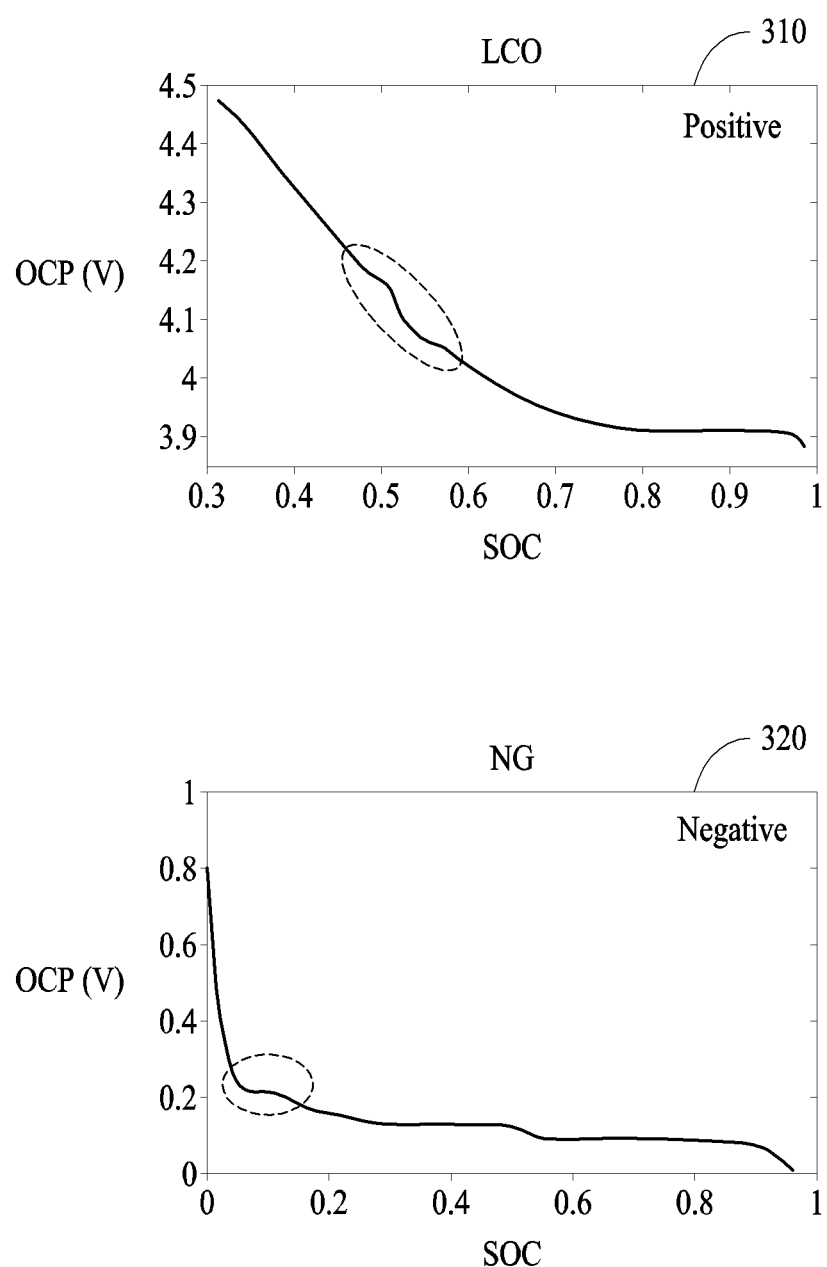
FIG. 3 is an example graph illustrating an equilibrium potential versus (vs) an SOC.

FIG. 3 is a graph illustrating an example of equilibrium potential vs an SOC.

Figure 4:
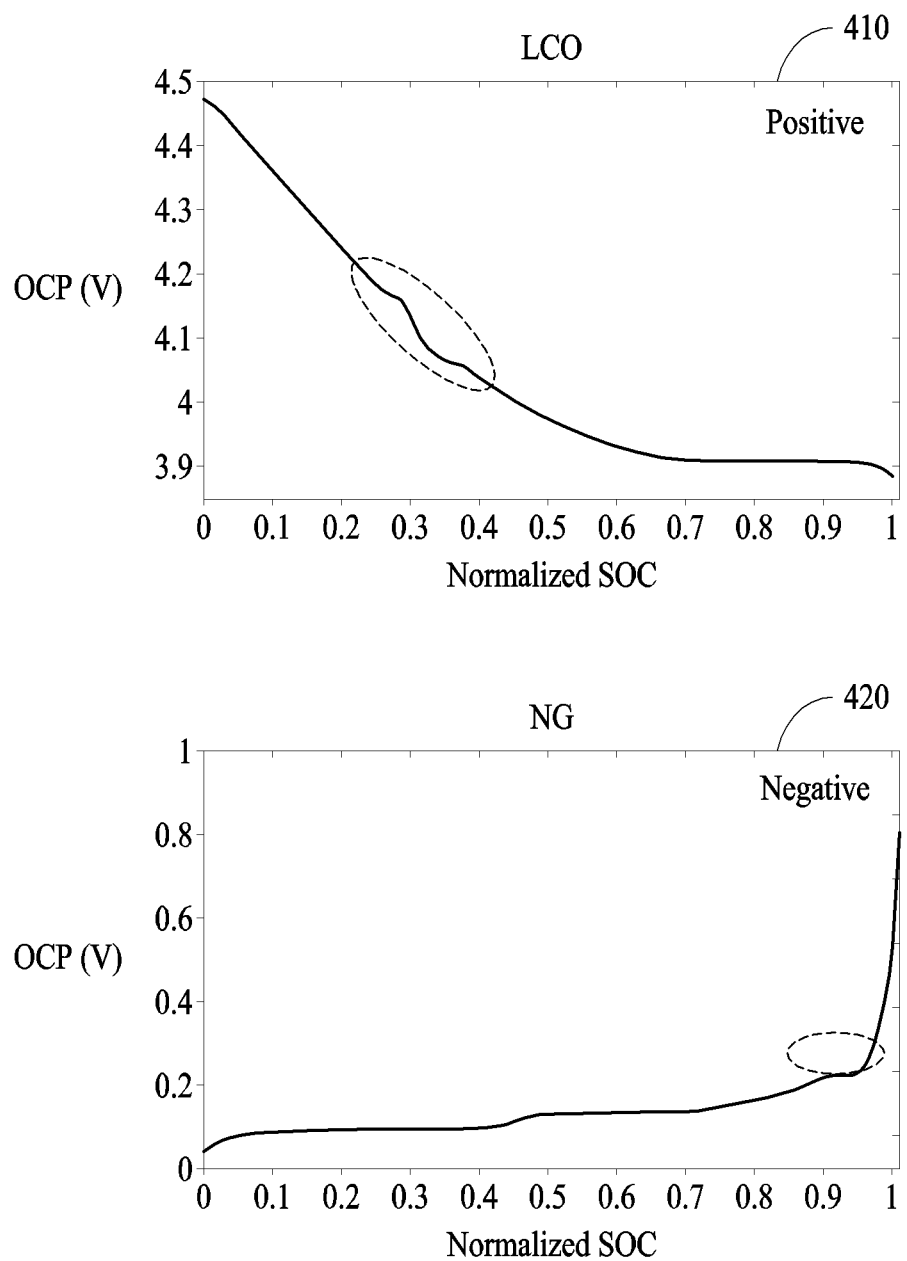
FIG. 4 is an example graph illustrating an equilibrium potential vs a normalized electrode SOC.

FIG. 4 is a graph illustrating an example of an equilibrium potential vs a normalized electrode SOC.

Figure 5:
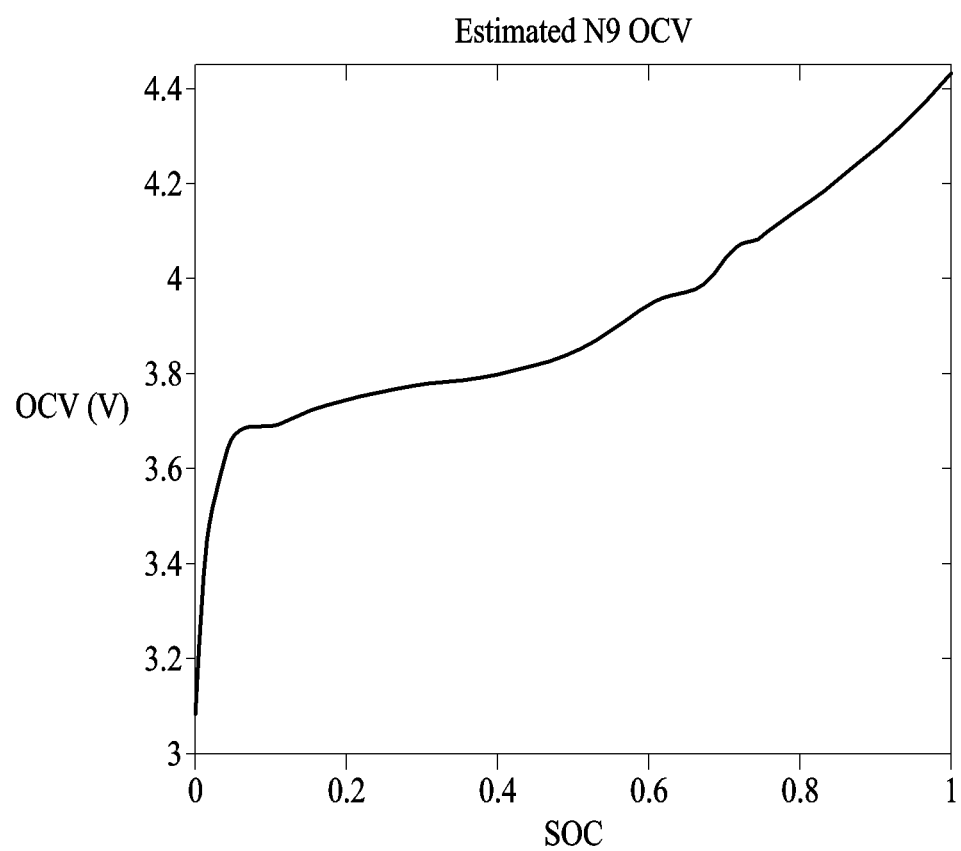
FIG. 5 is an example graph illustrating a cell equilibrium potential vs an SOC estimated using an electrode open circuit voltage (OCV).

FIG. 5 is a graph illustrating an example of a cell equilibrium potential vs an SOC estimated using an electrode OCV.

A cell OCV may be obtained using Equation 1 below, and $SOC_{norm}$ may be obtained using Equation 2 below.

Cell OCV=Cathode OCP−Anode OCP [Equation 1]

In Equation 1, Cell OCV denotes an OCV of a cell of a battery, Cathode OCP denotes an OCP of a cathode, and Anode OCP denotes an OCP of an anode.

$$SOC_{norm} = \frac{SOC - SOC_{min}}{SOC_{max} - SOC_{min}}$$ [Equation 2]

In Equation 2, $SOC_{min}$ denotes a minimum value of SOC, and $SOC_{max}$ denotes a maximum value of SOC.

Figure 6:
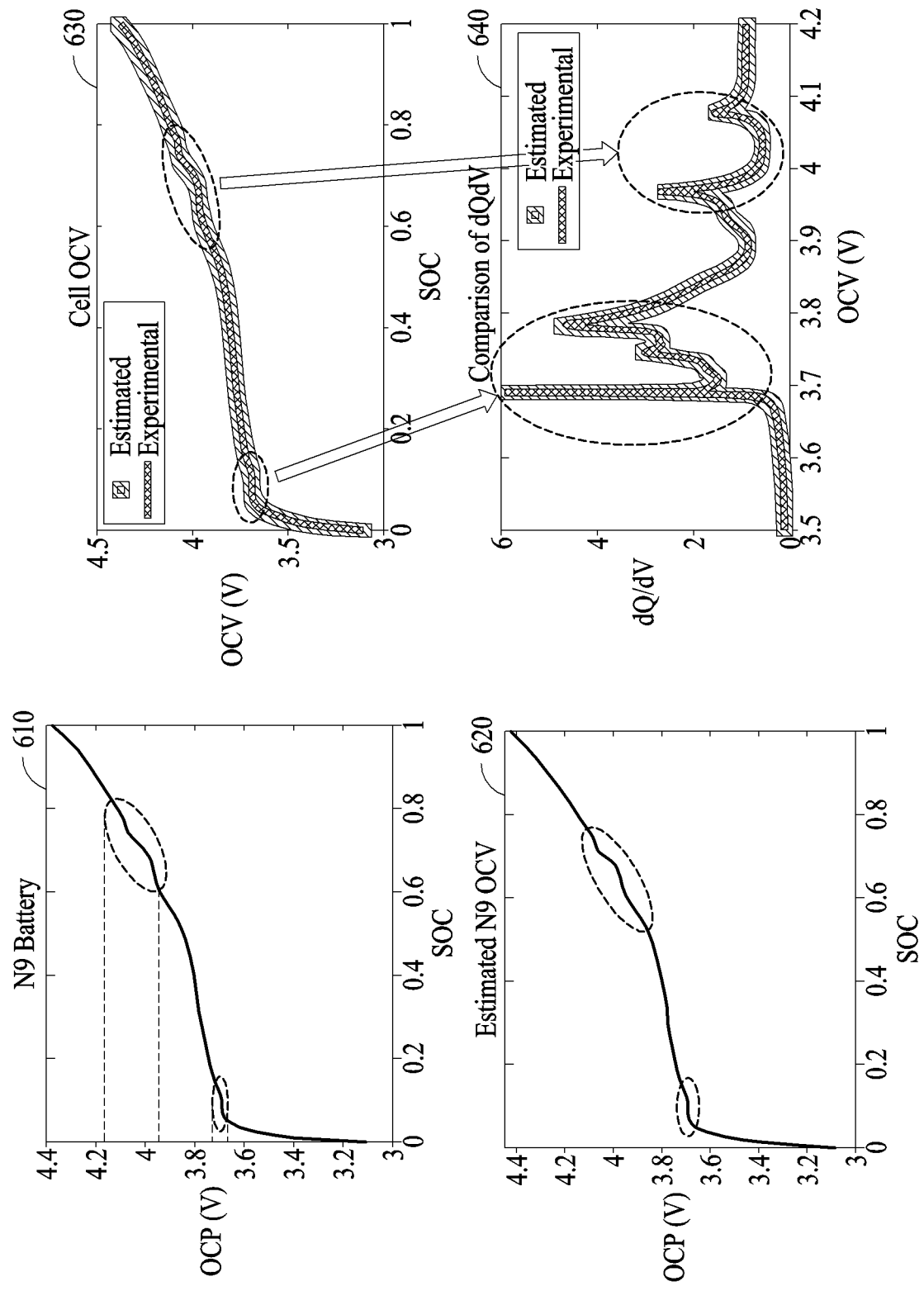
FIG. 6 is an example graph illustrating peak mapping in a dQ/dV vs V plot.

FIG. 6 is a graph illustrating an example of a peak mapping in a dQ/dV vs V plot.

Referring to FIG. 6, 610 is a graph indicating an OCV of a commercial battery, and 620 is a graph indicating an OCV estimated from an electrode. 630 is a graph indicating a comparison between a cell OCV estimated after optimizing an electrode SOC value and a commercial battery OCV. 640 is a graph indicating a comparison of peaks in a dQ/dV vs V plot between estimated and commercial batteries.

Figure 7:
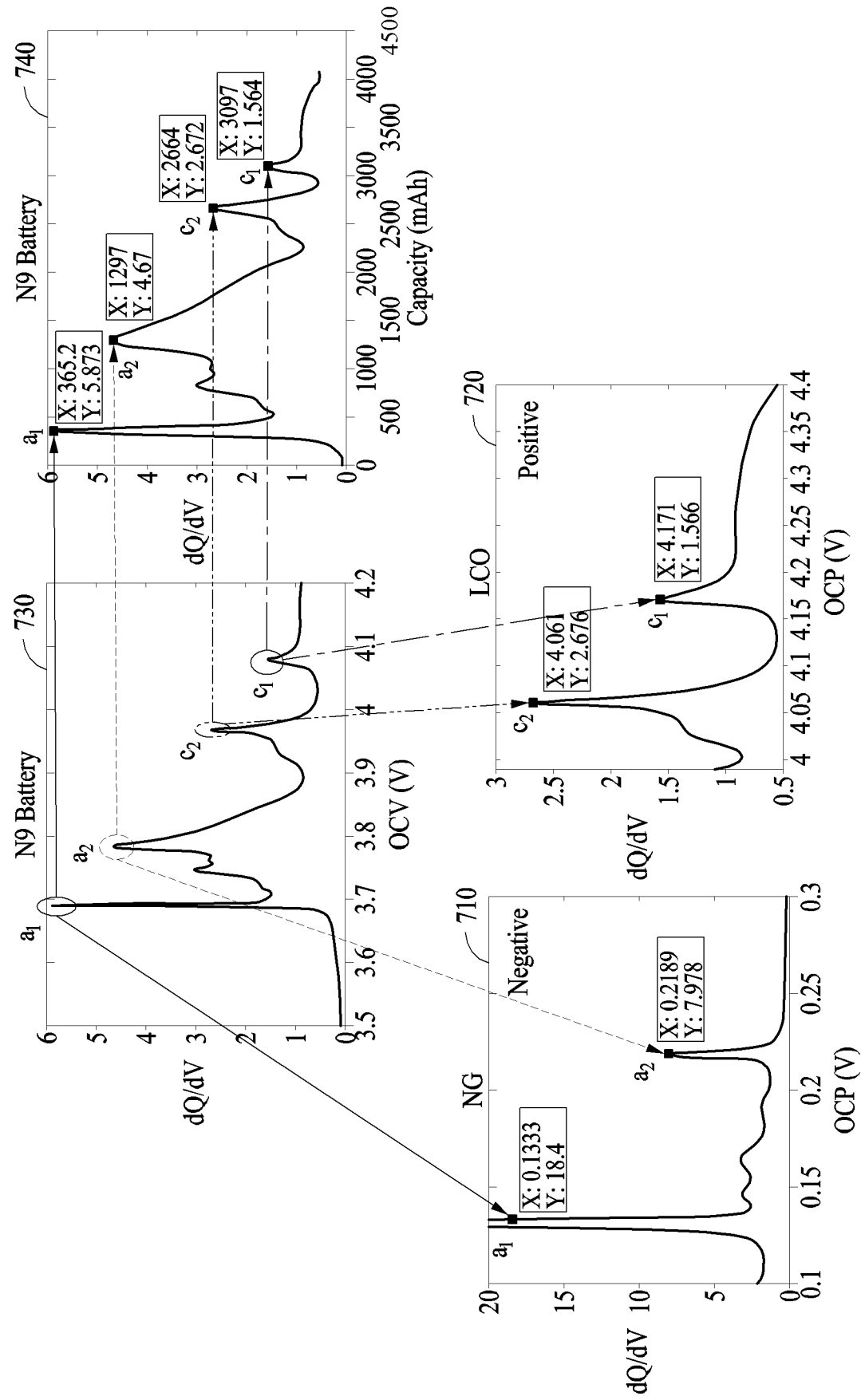
FIG. 7 is an example graph illustrating peak mapping in a dQ/dV vs Q plot.

FIG. 7 is graph illustrating an example of a peak mapping in a dQ/dV vs Q plot.

Referring to FIG. 7, 710 is a graph indicating a dQ/dV vs V plot of natural graphite (NG). 720 is a graph indicating a dQ/dV vs V plot of LCO. 730 is a graph indicating a dQ/dV vs V plot of a commercial battery. 740 is a graph indicating a dQ/dV vs Q plot of a commercial battery.

In an example, peak mapping in a dQ/dV vs Q plot may be obtained as described below.

Anode and cathode peaks in a dQ/dV vs V plot of a commercial battery may be identified by mapping the peaks to the individual electrodes in a dQ/dV vs V plot of an individual electrode.

Anode and cathode peaks in the dQ/dV vs V plot of the commercial battery may be mapped to a dQ/dV vs Q plot of the commercial battery to estimate a capacity between two peaks of each electrode.

Anode and cathode peak voltage values may be obtained from 710 and 720 in FIG. 7, respectively, which are as indicated in Table 1 below.

Anode and cathode peak capacity values may be estimated from 730 and 740 in FIG. 7 (refer to Table 1 below).

TABLE 1

| Electrodes | Q1 (mAh) | Q2 (mAh) | V1 (V) | V2 (V) |
|---|---|---|---|---|
| Anode | 365 | 1297 | 0.133 | 0.218 |
| Cathode | 3097 | 2664 | 4.171 | 4.061 |

Figure 8:
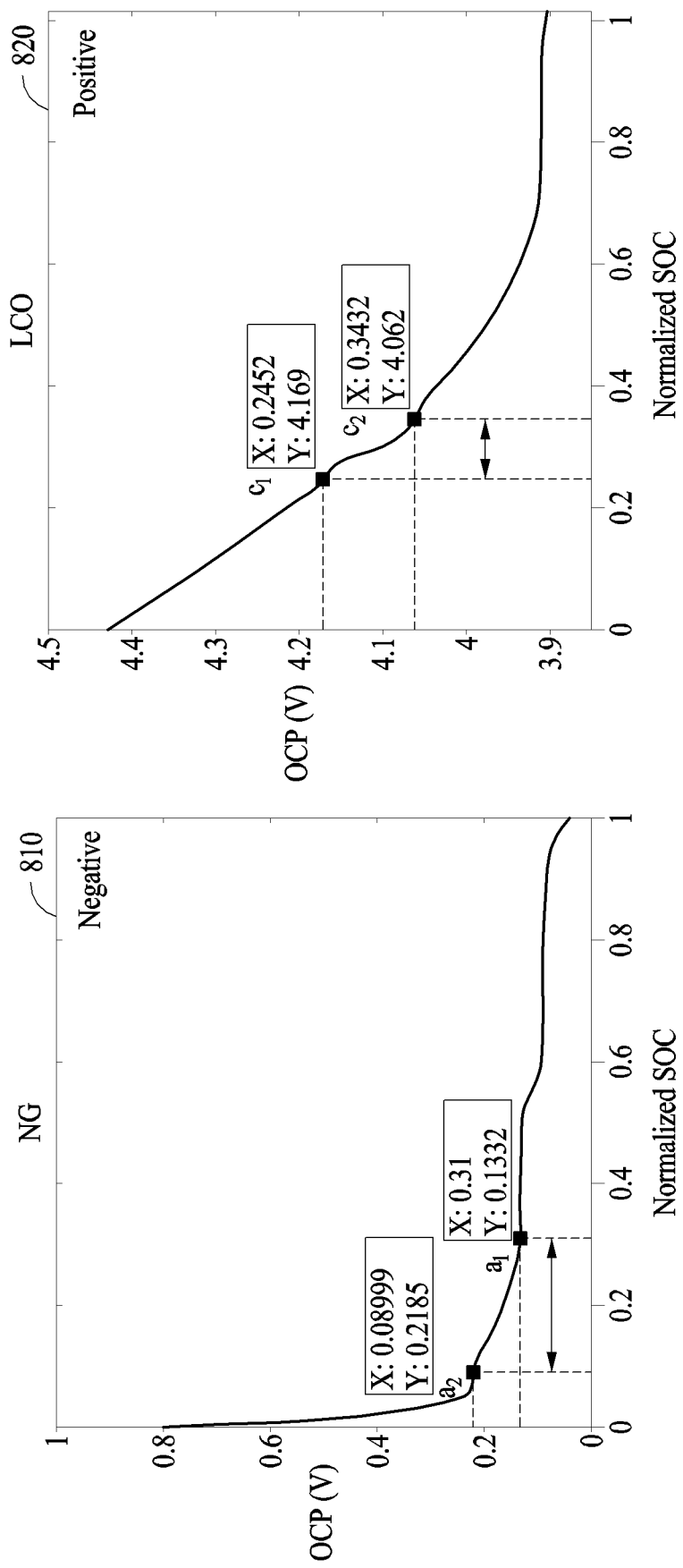
FIG. 8 is an example graph illustrating an electrode loading calculation.

FIG. 8 is a graph illustrating an example of an electrode loading calculation.

Referring to FIG. 8, 810 is a graph indicating an OCP plot of NG, and 820 is a graph indicating an OCP plot of LCO.

In an example, the electrode loading calculation may be determined as described below.

An anode and a cathode may have, as peaks, voltage values obtained from 810 and 820 in FIG. 8.

Respective SOC values of the anode and the cathode corresponding to voltages may be obtained from 810 and 820 in FIG. 8.

A ΔSOC value of the anode may equal to a difference between anode peak SOC values, which may be estimated using Equations 4a and 4b below. Also, a ΔSOC value of the cathode may be estimated in a similar manner.

$(\Delta Q)_{cell}$ for the anode may equal to a capacity difference between peak values, which may be estimated using Equations 3a and 3b below. Also, $(\Delta Q)_{cell}$ for the cathode may be estimated in a similar manner.

An active material load of the anode and the cathode of the commercial battery may be obtained using Equation 5 below.

The peak voltages and the SOC values of the anode and the cathode, and corresponding capacity values of the commercial battery are indicated in Table 2 below.

TABLE 2

| | Q-1(mAh) | Q-2(mAh) | V-1(V) | V-2(V) | SOC-1 | SOC-2 |
|---|---|---|---|---|---|---|
| Anode | 365 | 1297 | 0.133 | 0.218 | 0.312 | 0.089 |
| Cathode | 3097 | 2664 | 4.171 | 4.061 | 0.245 | 0.343 |

$(\Delta Q)_{cell}$ for cathode=abs$(Q_{c2}-Q_{c1})$ [Equation 3a]

In Equation 3a above, $(\Delta Q)_{cell}$ denotes a capacity difference between two peaks. $Q_{c1}$ and $Q_{c2}$ denote respective values at two peaks ($c_1$, $c_2$) of the cathode. abs( ) denotes an absolute value function.

$(\Delta Q)_{cell}$ for anode=abs$(Q_{a2}-Q_{a1})$ [Equation 3b]

In Equation 3b above, $(\Delta Q)_{cell}$ denotes a capacity difference between two peaks. $Q_{a1}$ and $Q_{a2}$ denote respective values at two peaks ($a_1$, $a_2$) of the anode. abs( ) denotes an absolute value function.

$(\Delta SOC)_{electrode}$ for cathode=abs$(SOC_{c2}-SOC_{c1})$ [Equation 4a]

In Equation 4a above, $(\Delta SOC)_{electrode}$ denotes a difference between two peak SOC values. $SOC_{c1}$ and $SOC_{c2}$ denotes respective SOC values at two peaks ($c_1$, $c_2$) of the cathode. abs( ) denotes an absolute value function.

$(\Delta SOC)_{electrode}$ for anode=abs$(SOC_{a2}-SOC_{a1})$ [Equation 4b]

In Equation 4b, $(\Delta SOC)_{electrode}$ denotes a difference between two peak SOC values. $SOC_{a1}$ and $SOC_{a2}$ denotes respective SOC values at two peaks ($a_1$, $a_2$) of the anode. abs( ) denotes an absolute value function.

$$\text{Active material loading in electrode} = \frac{(\Delta Q)_{cell}}{(\Delta SOC)_{electrode}} \quad \text{[Equation 5]}$$

$$\text{Anode} = \frac{\text{abs}(1297-365)}{\text{abs}(0.089-0.312)} = 4179 \; mAh$$

$$\text{Cathode} = \frac{\text{abs}(2664-3097)}{\text{abs}(0.343-0.245)} = 4418 \; mAh$$

The electrodes may lose a capacity during an operation and cycling of a cell at different rates.

Using the method described herein, capacities of individual electrodes may be checked at different aging levels.

Information associated with capacities of the individual electrodes may be used to predict an available capacity of the cell, and model degradation of the individual electrodes using the SOH determiner 114.

In an example, the active material content determiner 112 may obtain $SOC_0$ and $SOC_1$ of both positive and negative electrodes, a dQ/dV vs V curve of a commercial cell, and a dQ/dV vs V curve obtained from a difference in potential between the positive and negative electrodes, as illustrated in 730 in FIG. 7.

The active material content determiner 112 may estimate ICA (or dQ/dV vs V) curves of both the positive (e.g., 720 in FIG. 7) and the negative electrode (e.g., 710 in FIG. 7), and a dQ/dV vs Q curve of the commercial cell using an inverse-differential capacity curve (e.g., 740 in FIG. 7).

The active material content determiner 112 may identify peaks of the positive and negative electrodes in the dQ/dV vs V curve (e.g., 710 in FIG. 7) of the commercial cell by mapping peaks of the commercial cell to the peaks ($c_1$, $c_2$) (e.g., 720 in FIG. 7) of the positive electrode and the peaks ($a_1$, $a_2$) (e.g., 710 in FIG. 7) of the negative electrode, and similarly by mapping peaks between the dQ/dV vs V curve (e.g., 730 in FIG. 7) and the dQ/dV vs Q curve (740 in FIG. 7) of the commercial cell.

In an example, the active material content determiner 112 may record potential values (x-axis) at points $a_1$ and $a_2$ as $V_{a1}$ and $V_{a2}$, respectively, in 710 in FIG. 7, and record potential values (x-axis) at points $c_1$ and $c_2$ as $V_{c1}$ and $V_{c2}$, respectively, in 720 in FIG. 7. In addition, the active material content determiner 112 may record capacity values (x-axis) at points $a_1$, $a_2$, $c_1$, and $c_2$ as $Q_{a1}$, $Q_{a2}$, $Q_{c1}$, and $Q_{c2}$, respectively, in 740 in FIG. 7.

In an example, the active material content determiner 112 may estimate potential values $V_{a1}$ and $V_{a2}$ from 710 in FIG. 7 used to obtain corresponding SOC values as $SOC_{a1}$ and $SOC_{a2}$ from 810 in FIG. 8, and potential values at $V_{c1}$ and $V_{c2}$ from 720 in FIG. 7 used to obtain corresponding SOC values as $SOC_{c1}$ and $SOC_{c2}$.

The active material content determiner 112 may determine active material loading in the negative electrode using an equation $$\frac{\text{abs}(Q_{a2}-Q_{a1})}{\text{abs}(SOC_{a2}-SOC_{a1})}.$$

The active material content determiner 112 may also determine active material loading in the positive electrode using an equation $$\frac{\text{abs}(Q_{c2}-Q_{c1})}{\text{abs}(SOC_{c2}-SOC_{c1})}.$$

Figure 9:
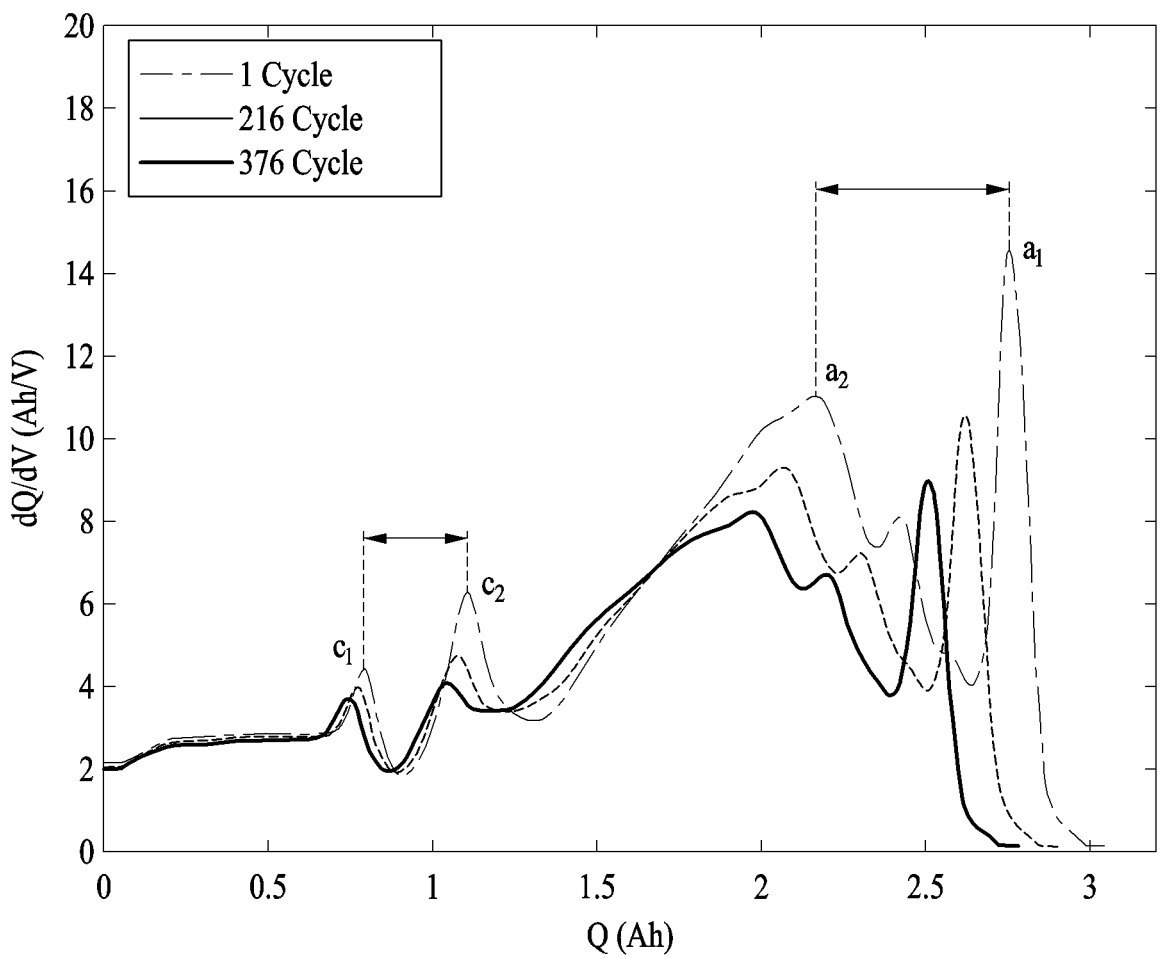
FIG. 9 is an example graph illustrating estimation of anode and cathode capacity losses by the aging of a battery.

FIG. 9 is graph illustrating an example of estimation of anode and cathode capacity losses because of the aging of a battery.

FIG. 9 illustrates how a dQ/dV vs Q plot of a commercial battery changes with cycle numbers. In this example, points $a_1$ and $a_2$ may correspond to an anode, and points $c_1$ and $c_2$ may correspond to a cathode. $Q_{cycle}$ for the anode and $Q_{cycle}$ for the cathode may be estimated using Equations 6 and 7, respectively. $Q_{cycle}$ for a commercial battery may equal to an end value of a dQ/dV vs Q curve. $Q_0$ denotes a capacity in a first cycle. A percentage capacity loss of the anode, the cathode, and the commercial battery with a cycle number may be estimated using Equation 8.

$$Q_{cycle} = (Q_{a1}-Q_{a2})_{cycle} \quad \text{[Equation 6]}$$

$$Q_{cycle} = (Q_{c2}-Q_{c1})_{cycle} \quad \text{[Equation 7]}$$

$$\% \text{ Capacity loss} = 100 * \frac{(Q_0-Q_{cycle})}{Q_0} \quad \text{[Equation 8]}$$

TABLE 3

| Cycle No. | Cell (% Cap Loss) | Anode (% Cap Loss) | Cathode (% Cap Loss) |
|---|---|---|---|
| 1 | 0 | 0 | 0 |
| 216 | 4.69 | 4.93 | 3.48 |
| 376 | 8.66 | 7.23 | 6.65 |
| 409 | 14.87 | 15.34 | 11.07 |

Table 3 above indicates percentage capacity losses of a cell, an anode, and a cathode based on cycle numbers.

A method of determining an active material content in an electrode of a battery that is performed by a BMS described herein will be described in detail with reference to FIGS. 10 through 12C.

Figure 10:
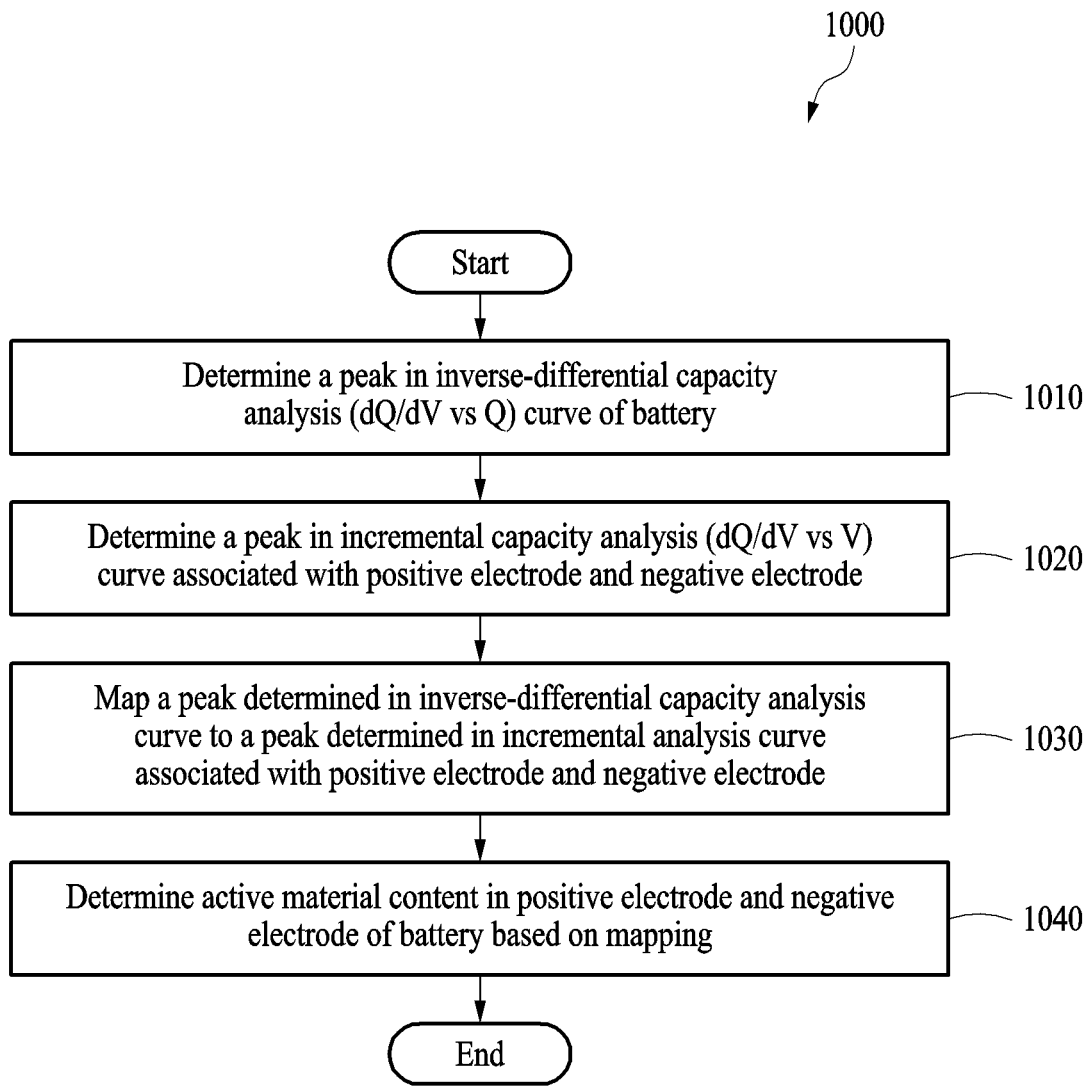
FIG. 10 is a diagram illustrating an example of a method of determining an active material content in a positive electrode and a negative electrode of a battery.

FIG. 10 is a diagram illustrating an example of a method of determining an active material content in a positive electrode and a negative electrode of a battery. The operations in FIG. 10 may be performed in the sequence and manner as shown, although the order of some operations may be changed or some of the operations omitted without departing from the spirit and scope of the illustrative examples described. Many of the operations shown in FIG. 10 may be performed in parallel or concurrently. One or more blocks of FIG. 10, and combinations of the blocks, can be implemented by special purpose hardware-based computer, such as a processor, that perform the specified functions, or combinations of special purpose hardware and computer instructions. For example, operations 1010 through 1040 to be described hereinafter with reference to FIG. 2A may be performed by the processor 110. In addition to the description of FIG. 10 below, the descriptions of FIGS. 1-9 are also applicable to FIG. 10, and are incorporated herein by reference. Thus, the above description may not be repeated here.

In operation 1010, the processor 110 determines at least one peak in an inverse-differential capacity analysis (or dQ/dV vs Q) curve of a cell.

In operation 1020, the processor 110 determines at least one peak in an ICA (or dQ/dV vs V) curve associated with the positive electrode and the negative electrode.

In operation 1030, the processor 110 maps the at least one peak that is determined in the inverse-differential capacity analysis curve to the at least one peak determined in the ICA curve associated with the positive electrode and the negative electrode.

In operation 1040, the processor 110 determines an active material content in the positive electrode and the negative electrode of a battery.

Figure 11:
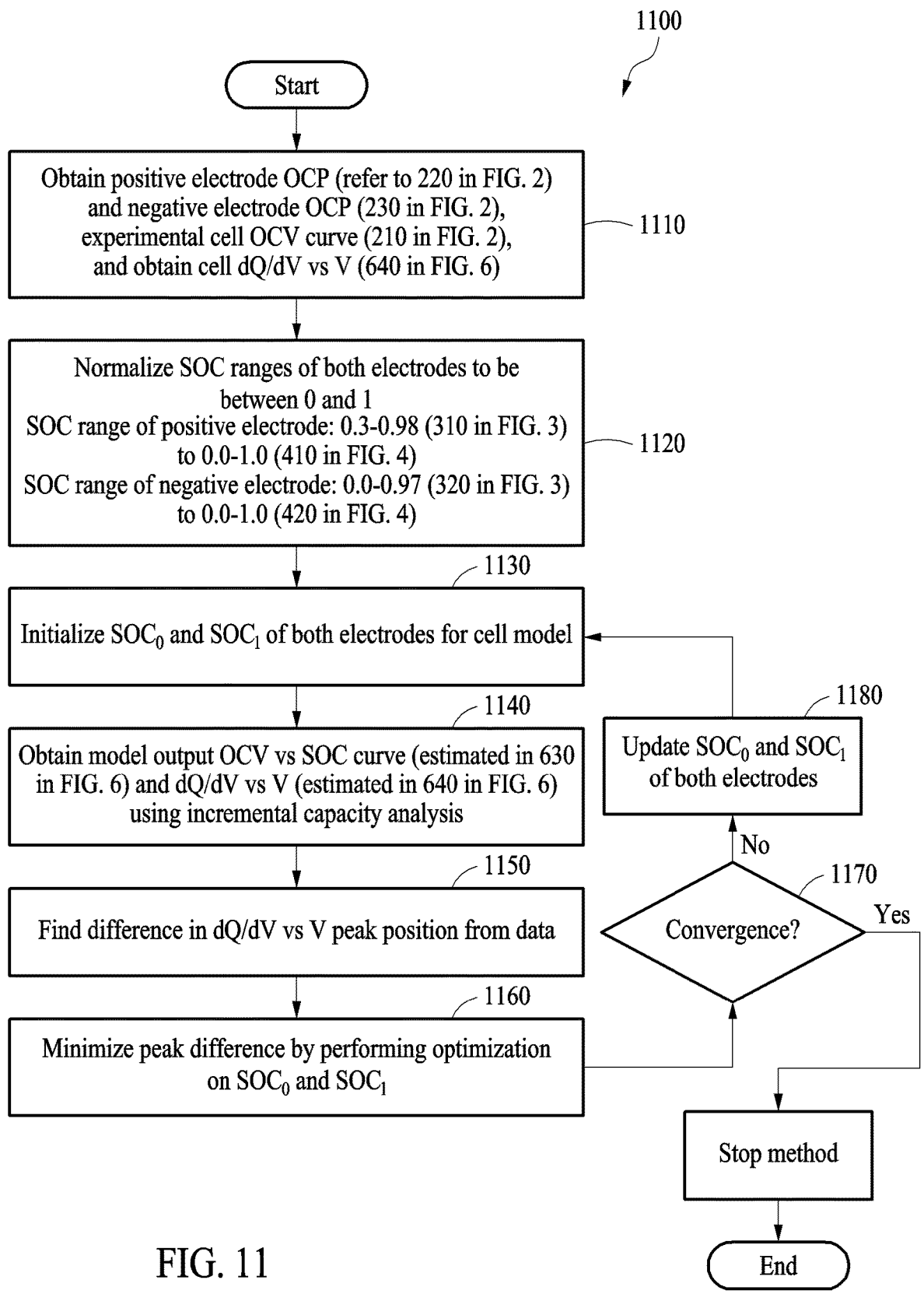
FIG. 11 is a diagram illustrating an example of a method of estimating a state of charge (SOC) range of the positive electrode and the negative electrode in conjunction with FIG. 10A.

FIG. 11 is a diagram illustrating an example of a method of estimating an SOC range of the positive electrode and the negative electrode in conjunction with FIG. 10. The operations in FIG. 11 may be performed in the sequence and manner as shown, although the order of some operations may be changed or some of the operations omitted without departing from the spirit and scope of the illustrative examples described. Many of the operations shown in FIG. 11 may be performed in parallel or concurrently. One or more blocks of FIG. 11, and combinations of the blocks, can be implemented by special purpose hardware-based computer, such as a processor, that perform the specified functions, or combinations of special purpose hardware and computer instructions. For example, operations 1110 through 1180 to be described hereinafter with reference to FIG. 11 may be performed by the processor 110. In addition to the description of FIG. 11 below, the descriptions of FIGS. 1-10 are also applicable to FIG. 11, and are incorporated herein by reference. Thus, the above description may not be repeated here.

In operation 1110, the processor 110 obtains an OCP curve (e.g., 220 in FIG. 2) of the positive electrode, an OCP curve (e.g., 230 in FIG. 2) of the negative electrode, and an OCV curve (e.g., 210 in FIG. 2) of an another cell, and obtain a cell dQ/dV vs V (e.g., 640 in FIG. 6) using an ICA.

In operation 1120, the processor 110 normalizes SOC ranges of the two electrodes to be between 0 and 1.

The processor 110 normalizes the SOC range for the positive electrode to be from 0.3-0.98 (as illustrated in 310 in FIGS. 3) to 0.0-1.0 (as illustrated in 410 in FIG. 4).

The processor 110 normalizes the SOC range for the negative electrode to be from 0.0-0.97 (as illustrated in 320 in FIG. 3) to 0.0-1.0 (as illustrated in 420 in FIG. 4). In operation 1130, the processor 110 initializes $SOC_0$ and $SOC_1$ of the two electrodes for a cell model.

In operation 1140, the processor 110 obtains a model output which is an OCV vs SOC curve (as illustrated by "estimated" in 630 in FIG. 6), and dQ/dV vs V (as illustrated by "estimated" in 640 in FIG. 6) using the ICA.

In operation 1150, the processor 110 finds a difference in dQ/dV vs V peak positions based on data.

In operation 1160, the processor 110 performs optimization on $SOC_0$ and $SOC_1$ to minimize the peak difference.

In operation 1170, the processor 110 determines whether a convergence point is met.

When the convergence point is determined to be met as a result of operation 1170, the processor 110 stops such an algorithm.

In operation 1180, wen the convergence point is determined not to be met as the result of operation 1170, the processor 110 updates $SOC_0$ and $SOC_1$ of the electrodes.

Figure 12:
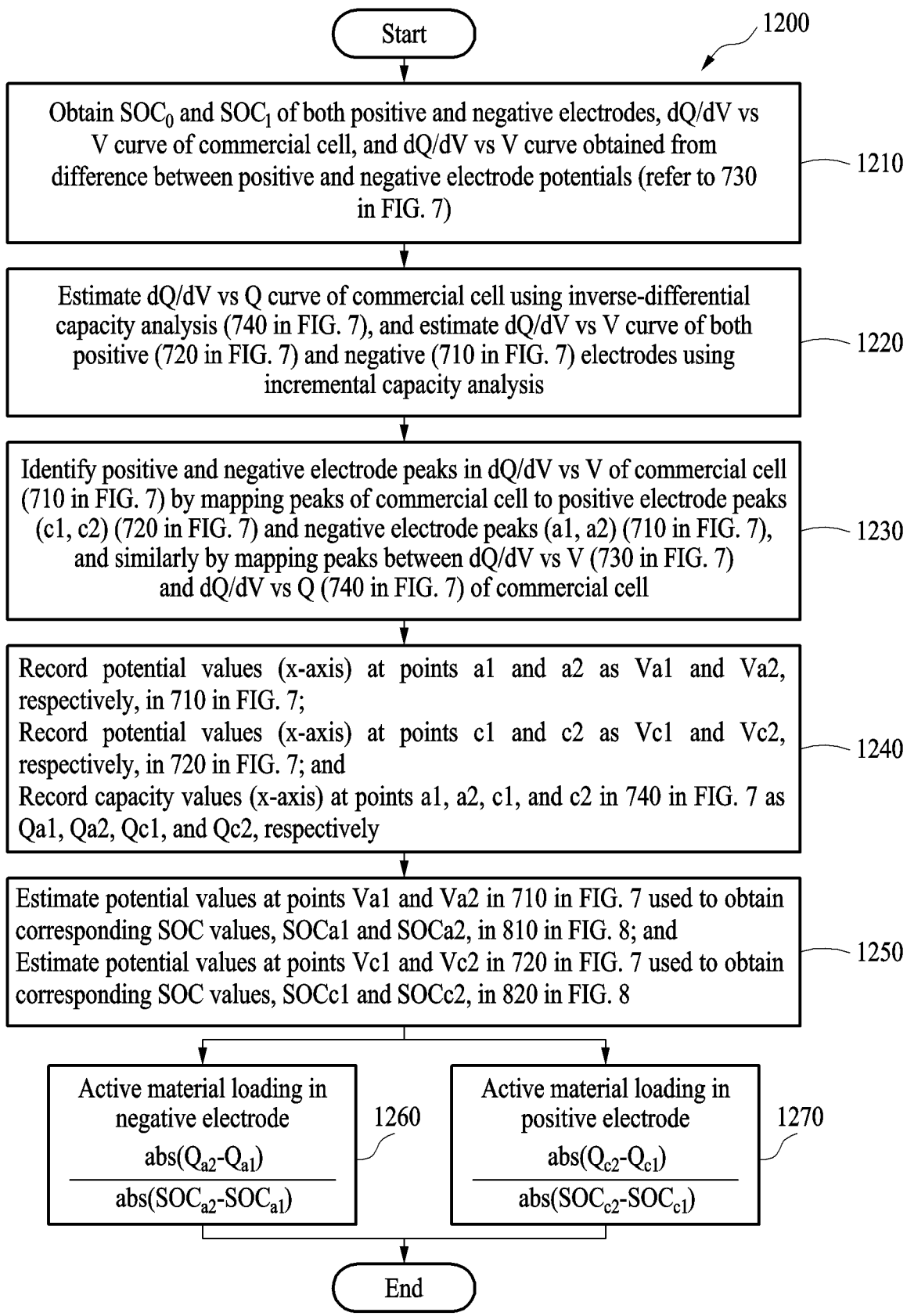
FIG. 12 is a diagram illustrating an example of a method of estimating active material loading and degradation in a positive electrode and a negative electrode.

FIG. 12 is a diagram illustrating an example of a method of estimating active material loading and degradation in a positive electrode and a negative electrode. The operations in FIG. 12 may be performed in the sequence and manner as shown, although the order of some operations may be changed or some of the operations omitted without departing from the spirit and scope of the illustrative examples described. Many of the operations shown in FIG. 12 may be performed in parallel or concurrently. One or more blocks of FIG. 12, and combinations of the blocks, can be implemented by special purpose hardware-based computer, such as a processor, that perform the specified functions, or combinations of special purpose hardware and computer instructions. For example, operations 1210 through 1270 to be described hereinafter with reference to FIG. 12 may be performed by the processor 110. In addition to the description of FIG. 12 below, the descriptions of FIGS. 1-11 are also applicable to FIG. 12, and are incorporated herein by reference. Thus, the above description may not be repeated here.

In operation 1210, the processor 110 obtains $SOC_0$ and $SOC_1$ of both positive and negative electrodes, a dQ/dV vs V curve of a commercial cell, and a dQ/dV vs V curve (e.g., 730 in FIG. 7) obtained from a difference in potential between the positive electrode and the negative electrode from FIG. 11.

In operation 1220, the processor 110 estimates dQ/dV vs V curves of both the positive electrode (e.g., 720 in FIG. 7) and the negative electrode (e.g., 710 in FIG. 7) using an ICA, and estimates a dQ/dV vs Q curve of the commercial cell (e.g., 740 in FIG. 7) using an inverse-differential capacity analysis.

In operation 1230, the processor 110 identifies peaks of the positive and negative electrodes in dQ/dV vs V (e.g., 710 in FIG. 7) of the commercial cell by mapping peaks of the commercial cell to peaks ($c_1$, $c_2$) (e.g., 720 in FIG. 7) of the positive electrode and peaks ($a_1$, $a_2$) (e.g., 710 in FIG. 7) of the negative electrode, and similarly by mapping peaks between dQ/dV vs V (e.g., 730 in FIG. 7) and dQ/dV vs Q (e.g., 740 in FIG. 7) of the commercial cell.

In operation 1240, the processor 110 records potential values (x-axis) at points $a_1$ and $a_2$ as $V_{a1}$ and $V_{a2}$, respectively, in 710 in FIG. 7, and records potential values (x-axis) at points $c_1$ and $c_2$ as $V_{c1}$ and $V_{c2}$, respectively, in 720 in FIG. 7. In addition, the processor 110 records capacity values (x-axis) at points $a_1$, $a_2$, $c_1$, and $c_2$ as $Q_{a1}$, $Q_{a2}$, $Q_{c1}$, and $Q_{c2}$, respectively, in 740 in FIG. 7.

In operation 1250, the processor 110 estimates potential values at $V_{a1}$ and $V_{a2}$ from 710 in FIG. 7 used to obtain corresponding SOC values as $SOC_{a1}$ and $SOC_{a2}$ in 810 in FIG. 8, and estimates potential values at $V_{c1}$ and $V_{c2}$ from 720 in FIG. 7 used to obtain corresponding SOC values as $SOC_{c1}$ and $SOC_{c2}$ in 820 in FIG. 8.

In operation 1260, the processor 110 determines active material loading in the negative electrode using an equation $$\frac{\text{abs}(Q_{a2} - Q_{a1})}{\text{abs}(SOC_{a2} - SOC_{a1})}.$$

In operation 1270, the processor 110 determines active material loading in the positive electrode using an equation $$\frac{\text{abs}(Q_{c2} - Q_{c1})}{\text{abs}(SOC_{c2} - SOC_{c1})}.$$

The examples described herein estimate positive and negative electrodes operating in a state of charge (SOC) range (or a voltage range), active material loading, and the performance degradation as a battery or cell ages.

The methods and apparatuses described herein may be used to determine active material loading in each electrode that may be used in on-board state estimation procedures. The methods and apparatuses may also estimate SOC ranges of both positive and negative electrodes. The method may be used to estimate active material loading in the positive and negative electrodes of any commercial battery without applying any destructive method. The methods and apparatuses are non-destructive, and thus, they may be used to estimate the electrode performance degradation by the aging of a battery. The electrode degradation information may help tune an operating voltage (or SOC) window and design the positive and negative electrodes in a better way to extend the life of the battery. The methods and apparatuses need minimal information about the commercial battery (or an electrode material). The methods and apparatuses may be applied to various levels of the aging of the battery to accurately determine a capacity loss in an individual electrode. This may help a user to predict an accurate SOH of the battery. It may also help design electrodes in a better way and to select better materials.

The proposed method may utilize measured currents, voltages, and capacities of individual electrodes and a commercial battery to obtain the characteristic curves such as dQ/dV vs Q and dQ/dV vs V curves to estimate operating SOC ranges of the electrodes, loading of active materials in both anode and cathode, and their capacity fade as the battery ages.

The examples described herein relates to a battery management system (BMS) and method for determining an active material content in at least one electrode of a battery. The BMS and the method described herein may determine at least one peak in an inverse-differential capacity analysis (e.g., dQ/dV vs Q) curve of a cell, determine at least one peak in an incremental capacity analysis (ICA) (e.g., dQ/dV vs V) curve associated with the at least one electrode, map the at least one peak determined in the inverse-differential capacity analysis curve to the at least one peak determined in the ICA curve associated with the at least one peak, and determine the active material content in the at least one electrode of the battery based on the mapping.

The examples described herein may be used to determine active material loading in an anode and a cathode for a fresh cell or a degraded cell in a reliable manner.

The examples described herein may be used to accurately determine the active material loading for the anode and the cathode, and maximum and minimum state of charge (SOC) limits that may increase the accuracy in estimating a state of the BMS.

The examples described herein may also be used to predict the capacity fade of the anode and the cathode to provide an accurate estimate of a state of health (SOH) of the battery and in understating a degradation mode.

The examples described herein may be used to determine an available capacity or a capacity loss of an individual electrode based on a life (or an SOH) of the battery.

For example, in the BMS, each active material in an electrode may undergo a phase transition during intercalation and de-intercalation of lithium. A region of the phase transition of each active material may occur at different levels of lithium intercalation/concentration (or electrode SOC). In such a region of the phase transition, an active material open circuit potential (OCP) may remain almost flat with an electrode SOC (or lithium concentration). A phase transition feature may be extracted by using an ICA (or dQ/dV vs V). An electrode operating SOC range may be obtained by matching features of an estimated battery open circuit voltage (OCV), which is $OCP_{cathode} - OCP_{anode}$, to features of a commercial battery OCV. To determine how much active material load is present in each electrode, an inverse-differential capacity analysis (or dQ/dV vs Q) plot of the battery may be used. Anode and cathode peaks may be identified from this plot. A charge difference ($\Delta Q$) between two peaks of the anode and two peaks of the cathode may be used to estimate their active material loading. The same procedure may be used to estimate an electrode capacity loss at various levels of battery degradation in a reliable and accurate manner.

The BMS 100, material content determiner 112, state of health (SOH) determiner 114 other apparatuses, devices, units, modules, and components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, an application-specific integrated circuit (ASIC), a field programmable gate array (FPGA), a programmable logic unit (PLU), a central processing unit (CPU), a graphics processing unit (GPU), a neural processing unit (NPU), or any other device capable of responding to and executing instructions in a defined manner.

The methods illustrated in FIGS. 2-12 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In an example, the instructions or software includes at least one of an applet, a dynamic link library (DLL), middleware, firmware, a device driver, an application program storing the method of determining an active material content in an electrode of a battery. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples a non-transitory computer-readable storage medium include read-only memory (ROM), random-access programmable read only memory (PROM), electrically erasable programmable read-only memory (EEPROM), random-access memory (RAM), magnetic RAM (MRAM), spin-transfer torque (STT)-MRAM, static random-access memory (SRAM), thyristor RAM (T-RAM), zero capacitor RAM (Z-RAM), twin transistor RAM (TTRAM), conductive bridging RAM (CBRAM), ferroelectric RAM (FeRAM), phase change RAM (PRAM), resistive RAM (RRAM), nanotube RRAM, polymer RAM (PoRAM), nano floating gate Memory (NFGM), holographic memory, molecular electronic memory device), insulator resistance change memory, dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In an example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A processor-implemented method of monitoring at least one electrode of a battery, the method comprising:

determining a first peak in an inverse-differential capacity analysis curve of the battery;
determining a second peak in an incremental capacity analysis (ICA) curve associated with the at least one electrode;
determining differences between peak positions based on the inverse-differential capacity analysis curve and the ICA curve;
mapping the first peak of the inverse-differential capacity analysis curve to the second peak of the ICA curve based on the differences;
determining an active material content in the at least one electrode of the battery based on the mapping; and
performing a performance optimization of the battery using the active material content in the at least one electrode.

2. The method of claim 1, further comprising:
determining an available capacity corresponding to the at least one electrode, in response to a decrease in a state of health (SOH) of the battery.

3. The method of claim 1, wherein the determining of the first peak in the inverse-differential capacity analysis curve comprises:
determining the first peak in the inverse-differential capacity analysis curve of a cell of the battery based on a state of charge (SOC) associated with the at least one electrode when the cell is fully discharged, an SOC associated with the at least one electrode when the cell is fully charged, an inverse-differential capacity analysis curve value associated with a commercial cell, and an ICA curve value obtained from a difference between a potential of a positive electrode and a potential of a negative electrode.

4. The method of claim 1, wherein the determining of the second peak in the ICA curve associated with the at least one electrode comprises:
determining the second peak in the ICA curve associated with the at least one electrode based on a state of charge (SOC) associated with the at least one electrode when a cell of the battery is fully discharged, an SOC associated with the at least one electrode when the cell is fully charged, an ICA curve value associated with a commercial cell, and an ICA curve value obtained from a difference between a potential of a positive electrode and a potential of a negative electrode.

5. The method of claim 1, wherein the determining of the active material content in the at least one electrode of the battery comprises:
obtaining first state of charge (SOC) values, $SOC_{a1}$ and $SOC_{a2}$, from potential values $V_{a1}$ and $V_{a2}$ comprising two peaks in the ICA curve associated with a positive electrode of the at least one electrode, respectively;
obtaining second SOC values, $SOC_{c1}$ and $SOC_{c2}$, from potential values at $V_{c1}$ and $V_{c2}$, respectively comprising two peaks in the ICA curve associated with a negative electrode of the at least one electrode; and
determining the active material content in the at least one electrode of the battery based on any one of the first SOC values, $SOC_{a1}$ and $SOC_{a2}$, and the second SOC values, $SOC_{c1}$ and $SOC_{c2}$.

6. The method of claim 1, wherein the determining of the active material content in the at least one electrode of the battery comprises determining the active material content in the at least one electrode of the battery based on any one of an absolute value of a difference between the $SOC_{a1}$ and the $SOC_{a2}$, and an absolute value of a difference between the $SOC_{c1}$ and the $SOC_{c2}$.

7. The method of claim 1, wherein the at least one electrode comprises a positive electrode and a negative electrode.

8. The method of claim 7, wherein the mapping of the first peak determined in the inverse-differential capacity analysis curve to the second peak determined in the ICA curve associated with the at least one electrode comprises:
obtaining an open circuit potential (OCP) curve of the positive electrode, an OCP curve of the negative electrode, an open circuit voltage (OCV) curve of a cell, and an ICA curve of the battery;
normalizing a state of charge (SOC) range of each of the positive electrode and the negative electrode to be between 0 and 1 based on the OCP curve of the positive electrode and the OCP curve of the negative electrode;
minimizing a peak difference between respective normalized SOC ranges of the positive electrode and the negative electrode based on the OCV curve and the ICA curve; and
mapping a peak value associated with the positive electrode and a peak value associated with the negative electrode based on the minimized peak difference.

9. The method of claim 1, wherein an inverse-differential capacity analysis comprises dividing a rate of change in capacity by a rate of change in voltage.

10. The method of claim 1, wherein an ICA comprises dividing a rate of change in capacity by a rate of change in voltage.

11. A non-transitory computer-readable storage medium storing instructions that, when executed by a processor, cause the processor to perform the method of claim 1.

12. A battery management system (BMS), comprising:
a processor configured to:
determine a first peak in an inverse-differential capacity analysis curve of a battery;
determine a second peak in an incremental capacity analysis (ICA) curve associated with at least one electrode;
determine differences between peak positions based on the inverse-differential capacity analysis curve and the ICA curve;
map the first peak of the inverse-differential capacity analysis curve to the second peak of the ICA curve based on the differences;
determine an active material content in the at least one electrode of a battery based on the mapping; and
perform a performance optimization of the battery using the active material content in the at least one electrode.

13. The BMS of claim 12, wherein the processor is further configured to:
determine an available capacity corresponding to the at least one electrode as a state of health (SOH) of the battery decreases.

14. The BMS of claim 12, wherein the processor is further configured to:
determine the inverse-differential capacity analysis curve of a cell of the battery based on a state of charge (SOC) associated with the at least one electrode when the cell is fully discharged, an SOC associated with the at least one electrode when the cell is fully charged, an inverse-differential capacity analysis curve value associated with a commercial cell, and an ICA curve value obtained from a difference in potential between a positive electrode and a negative electrode.

15. The BMS of claim 12, wherein the processor is further configured to:

determine the second peak in the ICA curve associated with the at least one electrode based on an SOC associated with the at least one electrode when a cell of the battery is fully discharged, an SOC associated with the at least one electrode when the cell is fully charged, an ICA curve value associated with a commercial cell, and an ICA curve value obtained from a difference in potential between a positive electrode and a negative electrode.

16. The BMS of claim 12, wherein the processor is further configured to:
   obtain first state of charge (SOC) SOC values as $SOC_{a1}$ and $SOC_{a2}$ from potential values at $V_{a1}$ and $V_{a2}$ comprising two peaks in the ICA curve associated with a positive electrode of the at least one electrode, respectively;
   obtain second SOC values as $SOC_{c1}$ and $SOC_{c2}$ from potential values at $V_{c1}$ and $V_{c2}$ comprising two peaks in the ICA curve associated with a negative electrode of the at least one electrode, respectively; and
   determine the active material content in the at least one electrode of the battery based on any one of the first SOC values, $SOC_{a1}$ and $SOC_{a2}$, and the second SOC values, $SOC_{c1}$ $SOC_{c2}$.

17. The method of claim 12, wherein the at least one electrode includes a positive electrode and a negative electrode.

18. The BMS of claim 17, wherein the processor is further configured to:
   obtain an open circuit potential (OCP) curve of a positive electrode, an OCP curve of a negative electrode, an open circuit voltage (OCV) curve of cell, and an ICA curve of the battery;
   normalize a state of charge (SOC) range of each of the positive electrode and the negative electrode to be between 0 and 1 based on the OCP curve of the positive electrode and the OCP curve of the negative electrode;
   minimize a peak difference between respective normalized SOC ranges of the positive electrode and the negative electrode based on the OCV curve and the ICA curve; and
   map a peak value associated with the positive electrode and a peak value associated with the negative electrode based on the minimized peak difference.

19. The method of claim 12, wherein an inverse-differential capacity analysis comprises dividing a rate of change in capacity by a rate of change in voltage.

20. The method of claim 12, wherein an ICA comprises dividing a rate of change in capacity by a rate of change in voltage.

* * * * *